United States Patent
Hung

(10) Patent No.: US 9,419,652 B2
(45) Date of Patent: Aug. 16, 2016

(54) BCH DECODING METHOD AND DECODER THEREOF

(71) Applicant: STORART TECHNOLOGY CO. LTD., Hisnchu (TW)

(72) Inventor: Jui-Hui Hung, Tainan (TW)

(73) Assignee: STORART TECHNOLOGY CO., LTD., Hsinchu (TW)

( * ) Notice: Subject to any disclaimer, the term of this patent is extended or adjusted under 35 U.S.C. 154(b) by 17 days.

(21) Appl. No.: 14/562,519

(22) Filed: Dec. 5, 2014

(65) Prior Publication Data

US 2016/0087650 A1    Mar. 24, 2016

(30) Foreign Application Priority Data

Sep. 24, 2014  (TW) .............................. 103133093 A

(51) Int. Cl.
*H03M 13/00*   (2006.01)
*H03M 13/15*   (2006.01)

(52) U.S. Cl.
CPC .......... *H03M 13/153* (2013.01); *H03M 13/152* (2013.01); *H03M 13/155* (2013.01); *H03M 13/1525* (2013.01)

(58) Field of Classification Search
CPC ............................ H03M 13/153; H03M 13/15
See application file for complete search history.

(56) References Cited

U.S. PATENT DOCUMENTS

| 7,962,836 B1 * | 6/2011 | Lee .................. H03M 13/1575 714/781 |
| 2005/0149834 A1 * | 7/2005 | Chen .................... H03M 13/05 714/781 |

* cited by examiner

*Primary Examiner* — Sam Rizk
(74) *Attorney, Agent, or Firm* — Li & Cai Intellectual Property (USA) Office

(57) ABSTRACT

The present disclosure illustrates a BCH decoding method and a decoder thereof. In this BCH decoding method, the BCH decoder receives an encode data at first, then calculates a syndrome of the encode data. After calculating the syndrome of the encode data, the BCH decoder calculates at least one error location of the encode data in response to the syndrome. Next, the BCH decoder detects at least one determining bit which a first bit string of the encode data comprises. The determining bit is configured for operatively determining whether to continue decoding the encode data. Finally, when the determining bit is detected, an error correction is then performed based upon the error location, such that the BCH decoder outputs decode data.

18 Claims, 6 Drawing Sheets

BCH DECODING METHOD AND DECODER THEREOF

BACKGROUND OF THE INVENTION

1. Field of the Invention

The instant disclosure relates to a decoding method and a decoder used therein; in particular, to a BCH decoding method and a decoder used therein.

2. Description of Related Art

In recent years, the wireless communication has well-developed, so that it dramatically increases the convenience of data transmission. However, there might be errors or distortion during the data transmission because of the noise interference or the reliability of the transmission media. The error control coding is used to recover the data having distortion. The often-used error control coding are Hamming Code, Reed Solomon Code, Bose Chaudhuri Hocquengham (BCH) Code, Low Density Parity Check Code (LDPC Code), etc. BCH code is one error control coding that is widely used in the storing device and the communication device, so as to assure the reliability and accuracy of the data.

The BCH encoding and the BCH decoding can both be implemented via a frame of the Linear Feedback Shift Register. However, compared with the BCH encoding, the BCH decoding is a more complex process. In details, please refer to FIG. 1, FIG. 1 shows a flow chart of a traditional BCH decoding method. The step S101 is to receive the encode data. The step S102 is to calculate the syndrome by the received encode data. The step S103 is to calculate the Error Location Polynomial via the syndrome. The step S104 is to calculate the error location via the error location polynomial. Finally, the step S105 is to perform the error correction according to the error location.

It is worth mentioning that, it might cost lots of time to calculate the error location via the error location polynomial. Therefore, compared with the BCH decoding method shown in FIG. 1, there is another BCH decoding method that can reduce the time consumption of the BCH decoding process. In details, please refer to FIG. 2, FIG. 2 shows a flow chart of another traditional BCH decoding method. The step S201 is to receive the encode data. The step S202 is to calculate the syndrome via the received encode data. The step S203 is to determine whether the syndrome is satisfied with the null vector. In other words, if the encode data with noise interference times the check matrix and the products are all zeroes (which means that the syndrome is satisfied with the null vector), and this encode data is an effective encode data and it enters into the step S208. If the syndrome is not satisfied with the null vector, it enters into the step S204. The step S204 is to calculate the error location polynomial via the syndrome. The step S205 is to calculate the error location via the error location polynomial. The step S206 is to determine whether the error correction is allowed. If the number of bits having errors in the encode data can still be handled by the error correction, it enters into the step S207. If the number of bits having errors in the encode data can't be handled by the error correction, it enters into the step S208. The step S207 is to perform the error correction according to the error location. The step S208 is to end the BCH decoding.

In other words, the traditional BCH decoding method shown in FIG. 2 is to determine whether to continue the BCH decoding process according to whether the syndrome is satisfied with the null vector. If the syndrome is satisfied with the null vector, the BCH decoder determines that the decoding for the encode data is successful, and outputs the BCH decode data. In other words, if the syndrome is satisfied with the null vector, the BCH decode would not execute the operation in the steps S204~S207, so as to reduce the time consumption of decoding.

From the above, the traditional BCH decoding method shown in FIG. 2 can reduce the time consumption of BCH decoding, but in the traditional BCH decoding method, the determination for whether the encode data can be successfully decoded should still be made after calculating the error location, such as the step S206. That is, if the encode data can't be successfully decoded, the time cost of operating for the encode data would become a waste, which thus decreases the throughput of decoding. Therefore, a BCH decoding method and the decode using the same are needed for both increasing the throughput of decoding and reducing the time consumption of decoding.

SUMMARY OF THE INVENTION

The instant disclosure provides a BCH decoding method. The BCH decoding method comprises: receiving an encode data; calculating a syndrome of the encode data; calculating at least one error location according to the syndrome; detecting at least one determining bit of a first bit string of the encode data; and performing an error correction based on at least one error location so as to output a decode data. Particularly, the encode data comprises the first bit string, a second bit string and a third bit string, the first bit string comprises a plurality of preset bits and the determining bit, the second bit string comprises a plurality of data bits, and the third bit string comprises a plurality of parity bits.

The instant disclosure provides a BCH encoder. The BCH encoder comprises an encoding unit and a transmitting unit. The encoding unit is configured to encode a source data so as to output an encode data. The transmitting unit is connected to the encoding unit so as to output the encode data. In particular, the step of encoding the source data further comprises: setting at least one bit of a first bit string among the source data as a determining bit; and encoding the source data so as to generate the encode data.

Moreover, the instant disclosure also provides a BCH decoder. The BCH decoder comprises a receiving unit and a BCH decoding unit. The receiving unit is configured to receive an encode data. The BCH decoding unit is connected to the receiving unit and configured to decode the encode data. In addition, the step of decoding the encode data comprises: receiving the encode data; calculating a syndrome of the encode data; calculating at least one error location based on the syndrome; detecting at least one determining bit of a first bit string of the encode data; and performing an error correction based on at least one error location so as to output a decode data. Particularly, the encode data comprises the first bit string, a second bit string and a third bit string, the first bit string comprises a plurality of preset bits and the determining bit, the second bit string comprises a plurality of data bits, and the third bit string comprises a plurality of parity bits.

To sum up, by using the BCH decoding method and the decoder used therein provided in the instant disclosure, it can determine whether the encode data is able to be successfully decoded via the syndrome and the determining bit. When the BCH decoder determines that the encode data can't be successfully decoded, the BCH decode would directly stop decoding. That is, by using the BCH decoding method and the decoder used therein provided in the instant disclosure, the situation that the encode data is found unable to be successfully decoded after calculating the error location can be prevented. Thereby, throughput when decoding can be increased. Moreover, by using the BCH decoding method and the decoder used therein provided in the instant disclosure, it will be unnecessary to calculate all syndromes to detect whether the syndromes are satisfied with a null vector. Thus, compared with the prior art, there is no need to use complex circuit designs to calculate all syndromes of the encode data. In other words, the instant disclosure reduces the cost on the BCH decoder and the hardware complexity.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. The following description is going to illustrate the method, the electronic device and the computer readable recording media for identifying confidential data provided by the instant disclosure with figures; however, it is not restricted by the embodiments below.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below and could be termed a second element, component, region, layer or section without departing from the teachings of the present disclosure. As used herein, the term "and/or" includes any and all combinations of one or more of the associated listed items.

Figure 1:
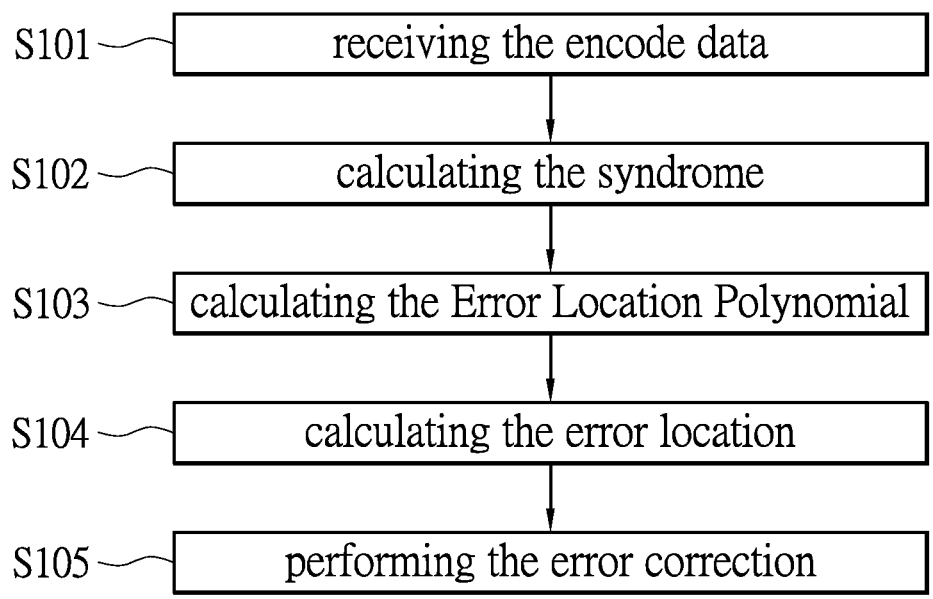
FIG. 1 shows a flow chart of a traditional BCH decoding method.
Figure 2:
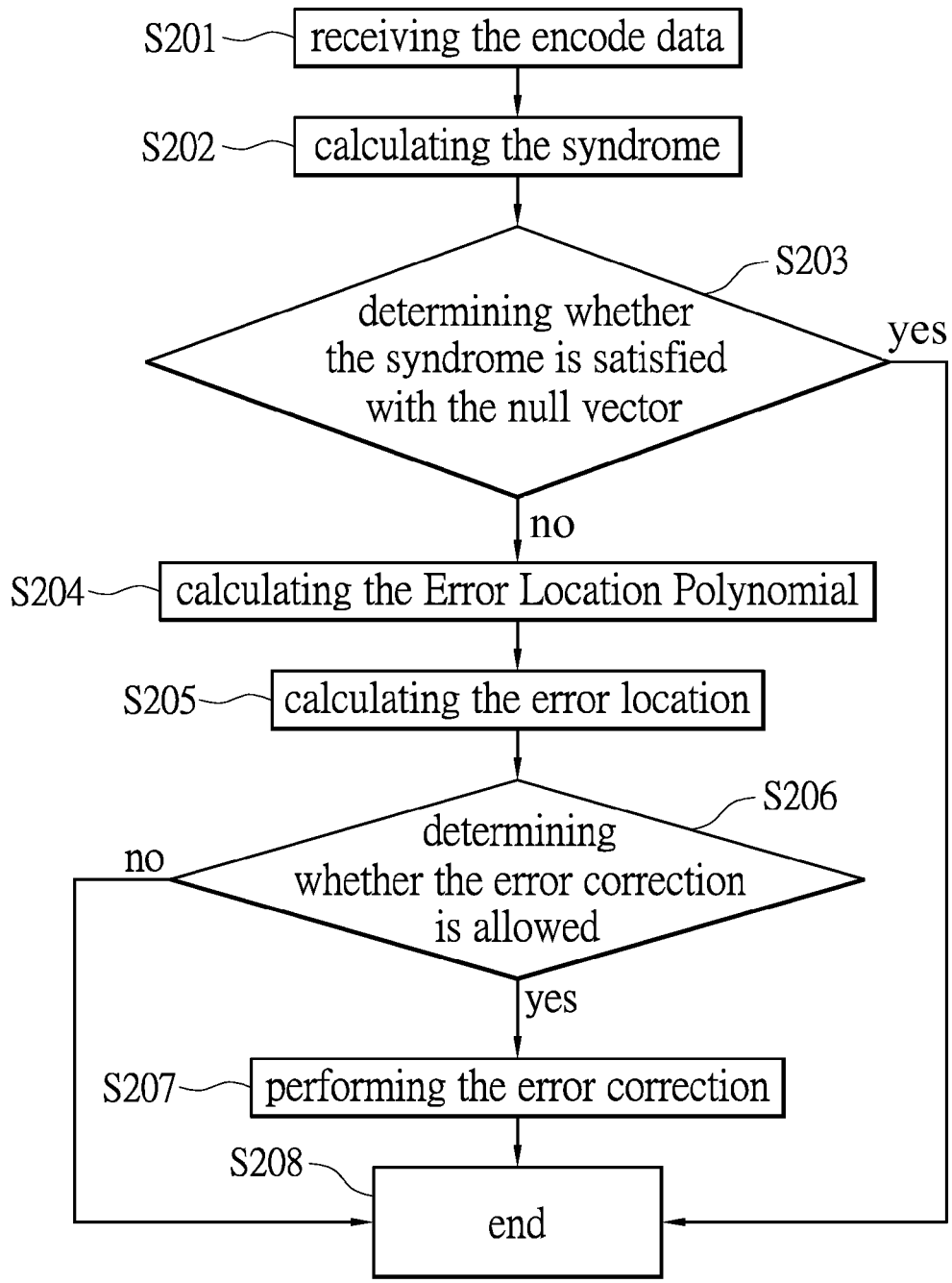
FIG. 2 shows a flow chart of another traditional BCH decoding method.
Figure 3A:
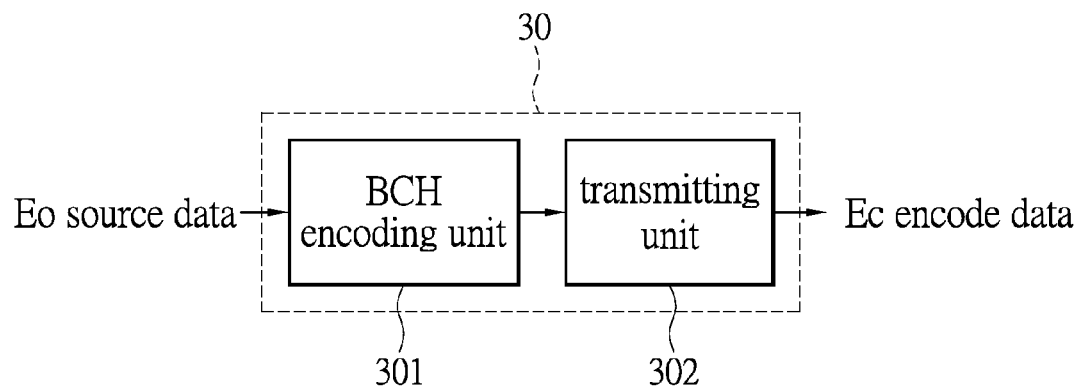
FIG. 3A shows a schematic diagram of a BCH encoder according to an embodiment of the instant disclosure.

Please refer to FIG. 3A, FIG. 3A shows a schematic diagram of a BCH decoder according to an embodiment of the instant disclosure. The BCH encoder 30 comprises a BCH encoding unit 301 and a transmitting unit 302. The BCH encoding unit 301 is configured to encode a source data Eo and output an encode data Ec. The transmitting unit 302 is connected to the encoding unit 301 so as to output the encode data Ec. It's worth mentioning that, the BCH encoding unit 301 is implemented by the frame of a linear feedback shift register.

Figure 4:
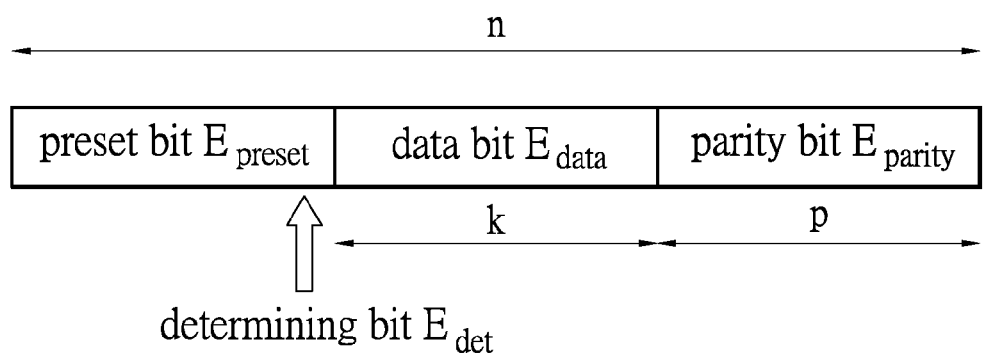
FIG. 4 shows a schematic diagram of encode data according to an embodiment of the instant disclosure.

In conjunction with FIG. 3A and FIG. 4, FIG. 4 shows a schematic diagram of encode data according to an embodiment of the instant disclosure. The encode data Ec comprises a plurality of preset bits Epreset, a plurality of data bits Edata and a plurality of parity bits Eparity. In this embodiment, the preset bit Epreset is before the data bit Edata. The parity bit Eparity is after the data bit Edata. The data bit Edata is a signal to be transmitted (that is, the source data Eo which is encoded). The parity bit Eparity is a signal having correction function. The preset bit Epreset is a signal that is not influential. It should be noticed that, the structure of the encode data Ec provided in this embodiment is merely one kind of embodiment, which is not used for restricting the structure of the encode data Ec.

The BCH code is a kind of block code. That is, in addition to the signal to be transmitted (e.g. the data bit Edata), the encode data Ec further comprises the parity bit Eparity. Moreover, a shorten BCH code is taken for example in this embodiment. Thus, in addition to the data bit Edata and the parity bit Eparity, the encode data Ec further comprises a plurality of preset bits Epreset. The preset bit Epreset would not be transmitted to the BCH encoding unit 301 for encoding, so the preset bit Epreset would not influence the initial status of the BCH encoding unit 301. In other words, the influence resulted by the preset bit Epreset is able to be omitted. It should be noticed that, the encoding unit 301 with the shorten BCH code is taken for example in this embodiment, but it is not limited thereto. The user can still design the encoding unit 301 depending on his own needs.

It is worth mentioning that, the value of the preset bit Epreset is related to the initial status of the linear feedback shift register. To be concrete, the preset bit Epreset can be changed as long as the initial status of the linear feedback shift register is changed. In order to describe the instant disclosure in an understandable and clear way, values of all preset bits are set to be zero. However, it is not limited thereto. The user can adjust the initial status of the linear feedback shift register on his own so as to set different preset bits Epreset.

For example, in this embodiment, the source data Eo is encoded with the shorten BCH code (n, k) so as to output the encode data Ec, wherein the n and k are integers which are larger than zero. The n refers to the codeword length of the encode data Ec. That is, the encode data Ec includes n bits. Among the n bits of the encode data Ec, there are k data bits Edata and p parity bits Eparity included. In other words, the encode data Ec includes n−(k+p) preset bits Epreset.

When encoding, the BCH encoding unit 301 inserts n−(k+p) preset bits Epreset before the source data Eo. After that, at least one of the n−(k+p) preset bits Epreset is chosen to be set as the determining bit Edet. The value of the determining bit Edet is determined by the user. In this embodiment, the value of the determining bit Edet is 1; however, it is not limited thereto. After the determining bit Edet has been set, the BCH encoding unit 301 encodes the source data Eo so as to generate the encode data Ec. In order to describe the instant disclosure in an understandable and clear way, in this embodiment, there is merely one bit among the n−(k+p) preset bits Epreset is set as the determining bit Edet, and the determining bit Edet is the bit that is before the data bit Edata. Besides, the user can also set the determining bit Edet at different bit locations or set a plurality of bits among the n−(k+p) preset bits Epreset as the determining bits Edet depending on actual needs, and is not limited thereto.

After the BCH encoding unit 301 has finished encoding the source data Eo, the BCH encoding unit 301 outputs the encode data Ec to the transmitting unit 302, and then the transmitting unit 302 outputs the encode data Ec.

Figure 3B:
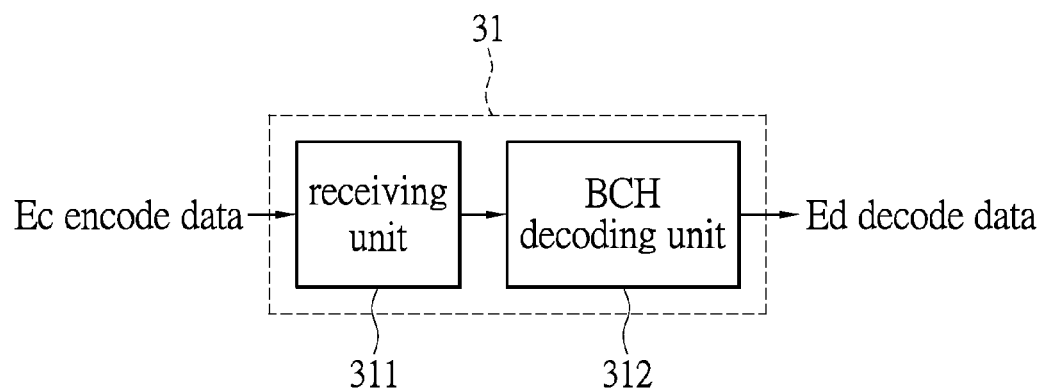
FIG. 3B shows a schematic diagram of a BCH decoder according to an embodiment of the instant disclosure.

Please refer to FIG. 3B, FIG. 3B shows a schematic diagram of a BCH decoder according to an embodiment of the instant disclosure. The BCH decode 31 comprises a receiving unit 311 and a BCH decoding unit 312. The receiving unit 311 is configured to receive the encode data Ec output by the transmitting unit 302. The BCH decoding unit 312 is connected to the receiving unit 311 and configured to decode the encode data Ec, so as to output the decode data Ed. It is worth mentioning that, the BCH decoding unit 312 is also implemented by the frame of a linear feedback shift register.

After the receiving unit 311 has received the encode data Ec, the receiving unit 311 outputs the encode data Ec to the BCH decoding unit 312. After the BCH decoding unit 312 has received the encode data Ec, the decoding process starts.

To be detailed, after the BCH decoding unit 312 has received the encode data Ec, the BCH decoding unit 312 at first determines whether the encode data Ec has errors, and whether encode data Ec has errors can be determined via the syndrome. Therefore, the BCH decoding unit 312 calculates the syndrome via the received encode data Ec. Generally speaking, when the syndrome is satisfied with a null vector, and the BCH decoding unit 312 would determine there is no error found during the transmission of the encode data Ec. On the other hand, when the syndrome is not satisfied with a null vector, the BCH decoding unit 312 would determine there is an error found during the transmission of the encode data Ec and thus starts to perform an error correction. The detailed calculation regarding to the syndrome is well-known for the skilled in the art, and thus the redundant information is not repeated.

It is worth mentioning that, generally speaking, regarding to the encode data Ec encoded with the shorten BCH code, the bit value of the preset bit Epreset would show a mode corresponding to the initial status of a linear feedback shift register (in this embodiment, the mode shown by the preset bit Epreset is all zero). However, in this embodiment, a determining bit Edet is set in the preset bit Epreset of which the value is 1. Thus, the syndrome calculated by the decoding unit 312 would not be satisfied with a null vector. That is, the decoding unit 312 need not calculate all syndromes of the encode data Ec, but can still determine that the syndrome is not satisfied with a null vector and thus continue the decoding process. For example, assuming that the encode data has 100 syndromes, the BCH decoding unit 312 merely needs to calculate ten of them for determining that the syndrome is not satisfied with a null vector. It should be noted that, the amount of the syndrome that the above BCH decoding unit 312 needs to calculate is not limited herein.

After the BCH decoding unit 312 determines that the syndrome is not satisfied with a null vector, it further detects whether it is the determining bit Edet that makes the syndrome not satisfied with a null vector. The BCH decoding unit 312 calculates the error location polynomial by using the syndrome. The BCH decoding unit 312 determines whether there is an error in other bits of the encode data Ec except for the determining bit Edet via terms of the error location polynomial. For example, when there is no error in both the data bit Edata and the parity bit Eparity of the encode data Ec, the error location polynomial calculated by the BCH decoding unit 312 would merely have one term that is corresponding to the determining bit Edet. On the other hand, when there is an error in the data bit Edata or the parity bit Eparity of the encode data Ec, the error location polynomial calculated by the BCH decoding unit 312 would at least have two terms. Particularly, the more the bit number of the data bit Edata having errors or the parity bit Eparity having errors is, the more terms the error location polynomial would have. It is worth mentioning that, currently there are lots of algorithms that can be used for calculating the error location polynomial, such as Peterson Gorenstein Zierler (PGZ) algorithm or Berlekamp-Massey(BM) algorithm. However, the algorithm that is used to solve the error location polynomial is not limited herein. Moreover, the detailed calculation regarding the error location polynomial is well-known for the skilled in the art, and thus the redundant information is not repeated.

After solving the error location polynomial, the BCH decoding unit 312 detects whether the determining bit Edet exists. The bit location of the determining bit Edet has been determined (according to the above, the determining bit Edet is the bit that is before the data bit Edata), so the BCH decoding unit 312 can directly detect whether the determining bit Edet exists. When the BCH decoding unit 312 detects no determining bit Edet, the BCH decoding unit 312 determines that the encode data Ec can't be successfully decoded and it ends the decoding process. When the BCH decoding unit 312 detects and finds the determining bit Edet, the BCH decoding unit 312 continues the decoding process.

After detecting and finding the determining bit Edet, the BCH decoding unit 312 calculates the error location via the error location polynomial. To be detailed, root of the error location polynomial is the error location, so the BCH decoding unit 312 can obtain the error location merely by solving the error location polynomial. In this embodiment, the error location polynomial is solved via the Chien Search Algorithm, so as to find the roots of the error location polynomial. Additionally, the detailed calculation regarding solving the error location polynomial via the Chien Search Algorithm is well-known to those skilled in the art, and thus the redundant information is not repeated.

Finally, after finding the error location, the BCH decoding unit 312 performs an error correction for the encode data Ec based on the error location, so as to output the decode data Ed.

In another embodiment, after the BCH decoding unit 312 calculates for the syndrome, it can further detect whether the syndrome is satisfied with a predetermined mode, so as to determine whether to continue the decoding process. In detail, the bit value of the preset bit Epreset of the encode data Ec and the position of the determining bit Edet have been determined, so the syndrome calculated by the decoding unit 312 would have a fixed mode if there is no error in the data bit Edata and the parity bit Eparity. In other words, the BCH decoding unit 312 defines the syndrome obtained when there is no error in the data bit Edata and the parity bit Eparity as the predetermined mode. Thereby, each time after the BCH decoding unit 312 receives the encode data Ec and calculates the syndrome, it can be determined whether there is an error in the data bit Edata and the parity bit Eparity merely by determining whether the syndrome is satisfied with the predetermined mode.

If the syndrome is satisfied with the predetermined mode, the decoding unit 312 determines that there is no error generated in the data bit Edata of the encode data Ec and the parity bit Eparity, and thus ends the decoding process. On the other hand, if the syndrome is not satisfied with the predetermined mode, the BCH decoding unit 312 determines that there is an error in the data bit Edata of the encode data Ec or the parity bit Eparity, and thus calculates the error location polynomial according to the syndrome and continues the decoding process.

Figure 5:
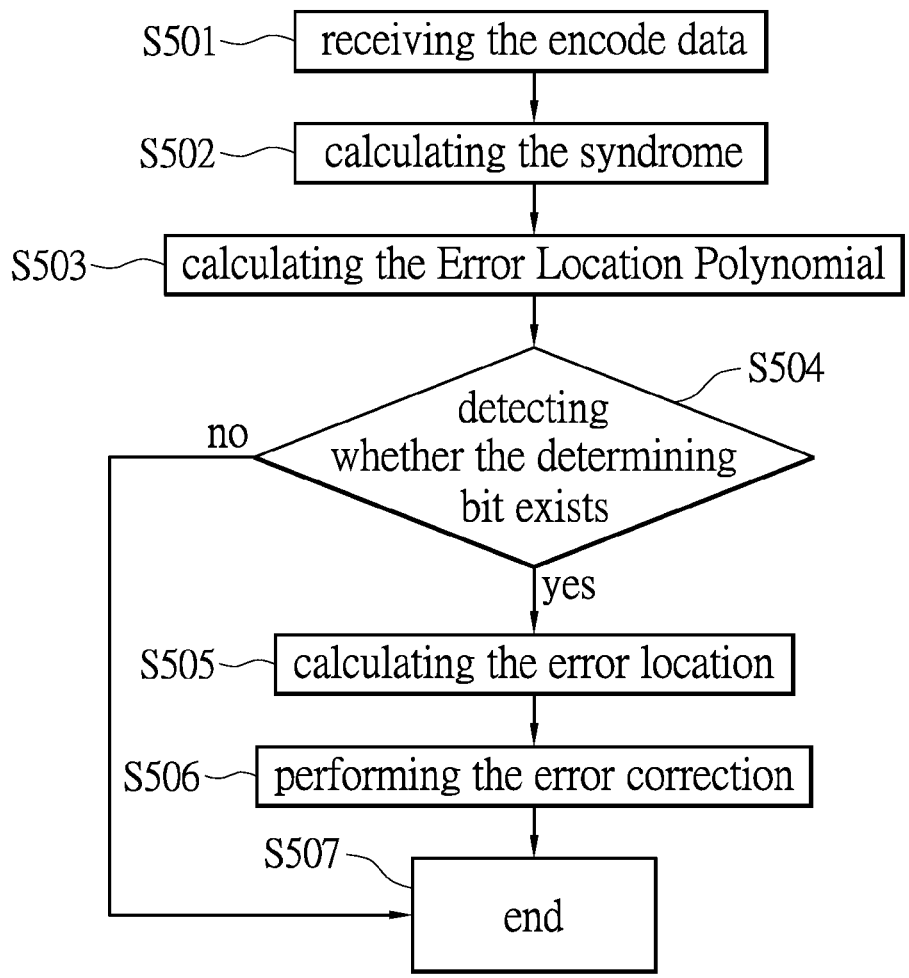
FIG. 5 shows a flow chart of a decoding method according to an embodiment of the instant disclosure.

After that, please refer to FIG. 5. FIG. 5 shows a flow chart of a decoding method according to an embodiment of the instant disclosure. The BCH decoding method is applied to the above BCH decoding unit 312, and the steps of the method comprises: in the step S501, the BCH decoding unit 312 receives the encode data Ec. The structure of the encode data Ec is the same as the above embodiment, and thus the redundant information is not repeated. In the step S502, the BCH decoding unit 312 calculates the syndrome via the received encode data Ec. After the BCH decoding unit 312 finds the syndrome, it would further determine whether the bit that makes the syndrome unsatisfied with the null vector is the determining bit Edet. The detailed calculation for obtaining the syndrome is an often-used calculation for those skilled in the art, and thus the redundant information is not repeated.

In the step S503, the BCH decoding unit 312 calculates the error location polynomial with the syndrome. The BCH decoding unit 312 determines whether there is an error in other bits of the encode data Ec except for the determining bit Edet via the terms of the error location polynomial, which makes the syndrome unsatisfied with the null vector. For example, if there is no error in both the data bit Edata of the encode data Ec and the parity bit Eparity, the BCH decoding unit 312 would merely have one term. This term corresponds to the determining bit Edet. On the other hand, if there is an error in the data bit Edata of the encode data Ec or the parity bit Eparity, the BCH decoding unit 312 would at least have two terms. The more the bits having errors are in the data bit Edata of the encode data Ec and the parity bit Eparity, the more terms the error location polynomial would have. It is worth mentioning that, there are a lot of algorithms that can be used for calculating the error location polynomial, for example, Peterson Gorenstein Zierler (PGZ) algorithm or Berlekamp-Massey (BM) algorithm, but it is not limited thereto. Moreover, the detailed calculation for calculating the error location polynomial is often-used for those skilled in the art, and thus the redundant information is not repeated.

In the step S504, the decoding unit 312 detects whether the determining bit Edet exists. The position of the determining bit Edet is determined (from the above, the position of the determining bit Edet is the bit before the data bit Edata in this embodiment), so the BCH decoding unit 312 can directly detect whether the determining bit Edet exists. If the BCH decoding unit 312 does not detect the determining bit Edet, the BCH decoding unit 312 determines that this encode data Ec cannot be successfully decoded, and it directly enters into the step S507 so as to end the decoding process. If the BCH decoding unit 312 detects the determining bit Edet, the BCH decoding unit 312 continues the decoding process and it enters into the step S505.

In the step S505, the BCH decoding unit 312 calculates for the error location via solving the error location polynomial. The root of the error location polynomial is the error location, so the BCH decoding unit 312 can find the error location merely by solving the error location polynomial. In this embodiment, the Chien Search Algorithm is used for solving the error location polynomial so as to find the root of the error location polynomial. Additionally, the detailed calculation for solving the error location polynomial via Chien Search Algorithm is often-used by those skilled in the art, and thus the redundant information is not repeated. In step S506, the BCH decoding unit 312 makes an error correction for the encode data Ec according to the error location, so as to output the decode data Ed. Finally, in the step S507, the BCH decoding unit 312 ends the decoding process.

Figure 6:
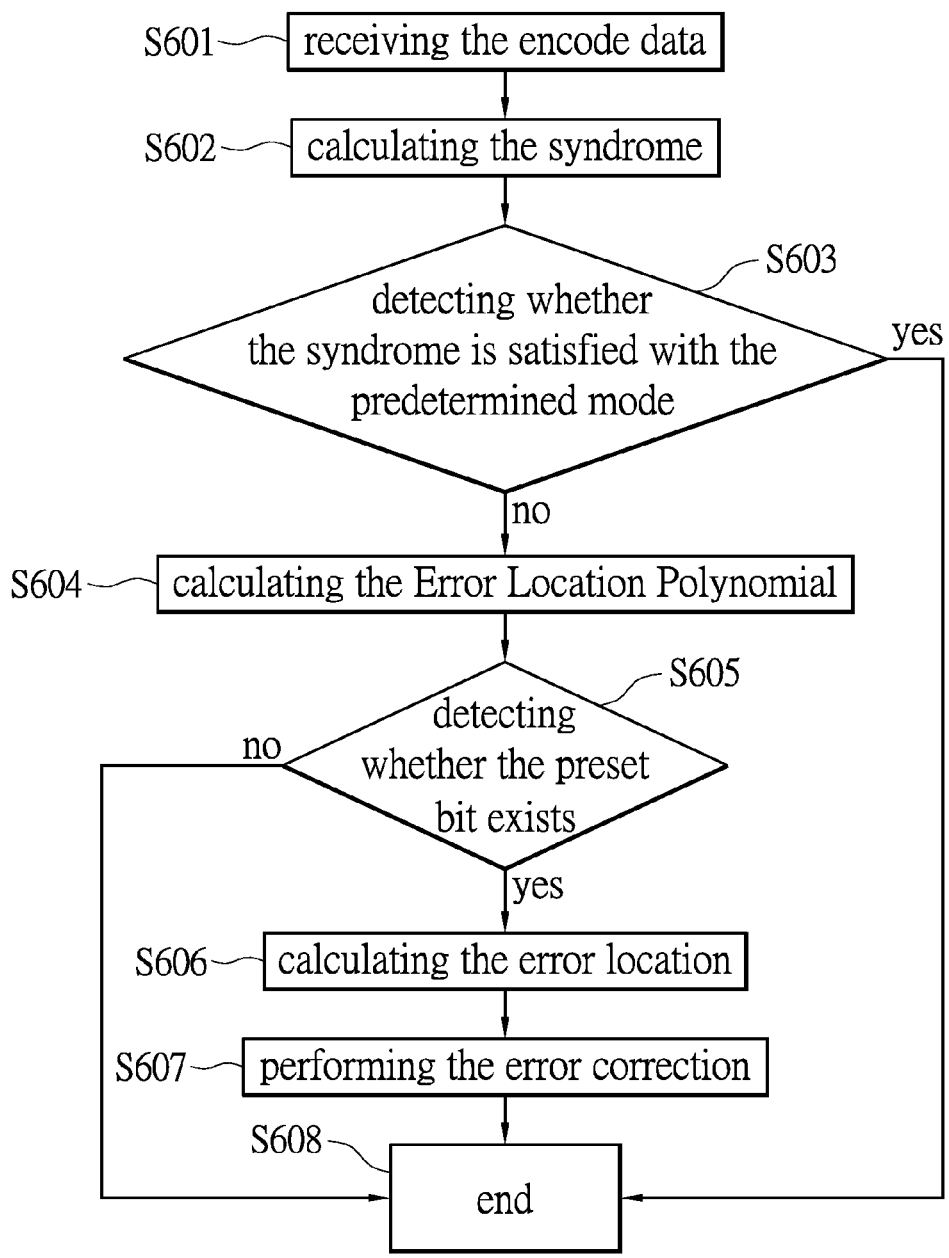
FIG. 6 shows a flow chart of a decoding method according to an embodiment of the instant disclosure.

Please refer to FIG. 6. FIG. 6 shows a flow chart of a decoding method according to an embodiment of the instant disclosure. The BCH decoding method in another embodiment of the instant disclosure can also be applied to the above BCH decoding unit 312, and the steps thereof are significantly identical to the BCH decoding method shown in FIG. 5 except for differences specified as follows. The major difference between the BCH decoding methods shown in FIG. 5 and FIG. 6 is that, in the step S603, the BCH decoding unit 312 detects whether the syndrome is satisfied with the predetermined mode so as to determine whether to continue the decoding process. In detail, the bit value of the preset bit Epreset of the encode data Ec and the position of the determining bit Edet have been determined, so the syndrome calculated by the BCH decoding unit 312 would have a fixed mode if there is no error in both the data bit Edata and the parity bit Eparity. In other words, the BCH decoding unit 312 defines the syndrome obtained when there is no error in the data bit Edata and the parity bit Eparity as a predetermined mode. After the BCH decoding unit 312 receives the encode data Ec and calculates the syndrome, it can be determined whether there is an error in the data bit Edata and the parity bit Eparity merely by determining whether this syndrome is satisfied with the predetermined mode.

If the syndrome is satisfied with the predetermined mode, the BCH decoding unit 312 determines that there is no error in the data bit Edata of the encode data Ec and the parity bit Eparity. That is, it enters into the step S608 and the decoding process is ended. On the other hand, if the syndrome is not satisfied with the predetermined mode, the BCH decoding unit 312 determines that there is an error in the data bit Edata of the encode data Ec or the parity bit Eparity and determines to enter into the step S604. In the steps S604~S607, the BCH decoding unit 312 operates in a similar manner as the embodiment disclosed in the steps S504~S506 shown in FIG. 5, and thus the redundant information is not repeated.

To sum up, by using the BCH decoding method and the decoder used therein provided in the instant disclosure, it can determine whether the encode data is able to be successfully decoded via the syndrome and the determining bit. When the BCH decoder determines that the encode data can't be successfully decoded, the BCH decode would directly stop decoding. That is, by using the BCH decoding method and the decoder used therein in the instant disclosure, it prevents the situation that the encode data is found unable to be successfully decoded after calculating the error location. Thereby, throughput when decoding can be increased. Moreover, by using the BCH decoding method and the decoder used therein in the instant disclosure, it is unnecessary to calculate all syndromes to detect whether the syndromes are satisfied with a null vector. Thus, compared with the prior art, in the instant disclosure, there is no need to use complex circuit designs to calculate all syndromes of the encode data. In other words, the instant disclosure reduces the cost on the BCH decoder and the hardware complexity.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:
1. A BCH decoding method, comprising:
receiving an encode data;
calculating a syndrome of the encode data;
calculating at least one error location according to the syndrome;

detecting at least one determining bit of a first bit string of the encode data, wherein the determining bit is configured for operatively determining whether to continue decoding the encode data; and performing an error correction based on at least one error location so as to output a decode data when the determining bit is detected;

wherein the encode data comprises the first bit string, a second bit string and a third bit string, the first bit string comprises a plurality of preset bits and the determining bit, the second bit string comprises a plurality of data bits, and the third bit string comprises a plurality of parity bits.

2. The BCH decoding method according to claim 1, wherein decoding is stopped when no determining bit is detected.

3. The BCH decoding method according to claim 1, wherein the step of encoding a source data further comprises:
setting at least one bit of the first bit string among the source data as the determining bit; and
encoding the source data so as to generate the encode data.

4. The BCH decoding method according to claim 3, wherein the determining bit is located at any bit of the first bit string.

5. The BCH decoding method according to claim 1, wherein the step of calculating at least one error location according to the syndrome comprises:
calculating an error location polynomial according to the syndrome; and
finding a root of the error location polynomial;
wherein the root of the error location polynomial is at least one error location.

6. The BCH decoding method according to claim 5, wherein the error location polynomial is solved via Berlekamp-Massey (BM) algorithm.

7. The BCH decoding method according to claim 5, wherein the error location polynomial is solved via Chien Search Algorithm so as to obtain at least one error location.

8. The BCH decoding method according to claim 1, wherein the BCH decoding method further comprises:
detecting whether the syndrome is satisfied with a predetermined mode; and
calculating the error location according to the syndrome when the syndrome is not satisfied with the predetermined mode.

9. The BCH decoding method according to claim 8, wherein decoding is stopped when the syndrome is satisfied with a predetermined mode.

10. A BCH encoder, comprising:
an encoding unit, configured to encode a source data so as to output an encode data; and
a transmitting unit, connected to the encoding unit so as to output the encode data;
wherein the step of encoding the source data further comprises:
setting at least one bit of a first bit string among the source data as a determining bit, wherein the determining bit is configured for operatively determining whether to continue decoding the encode data; and
encoding the source data besides the first bit string so as to generate the encode data.

11. The BCH encoder according to claim 10, wherein the determining bit is located at any bit of the determining bit.

12. A BCH decoder, comprising:
a receiving unit, configured to receive an encode data; and
a BCH decoding unit, connected to the receiving unit and configured to decode the encode data;
wherein the step of decoding the encode data comprises:
receiving the encode data;
calculating a syndrome of the encode data;
calculating at least one error location based on the syndrome;
detecting at least one determining bit of a first bit string of the encode data, wherein the determining bit is configured for operatively determining whether to continue decoding the encode data; and
performing an error correction based on at least one error location so as to output a decode data when the determining bit is detected;
wherein the encode data comprises the first bit string, a second bit string and a third bit string, the first bit string comprises a plurality of preset bits and the determining bit, the second bit string comprises a plurality of data bits, and the third bit string comprises a plurality of parity bits.

13. The BCH decoder according to claim 12, wherein decoding is stopped when no determining bit is detected.

14. The BCH decoder according to claim 12, wherein the step of calculating at least one error location according to the syndrome comprises;
calculating an error location polynomial according to the syndrome; and
finding a root of the error location polynomial;
wherein the root of the error location polynomial is at least one error location.

15. The BCH decoder according to claim 14, wherein the error location polynomial is solved via Berlekamp-Massey (BM) algorithm.

16. The BCH decoder according to claim 14, wherein the error location polynomial is solved via Chien Search Algorithm so as to obtain at least one error location.

17. The BCH decoder according to claim 12, wherein the step of decoding the encode data further comprises:
detecting whether the syndrome is satisfied with a predetermined mode; and
calculating at least one error location according to the syndrome when the syndrome is not satisfied with the predetermined mode.

18. The BCH decoder according to claim 17, wherein encoding is stopped when the syndrome is satisfied with a predetermined mode.

* * * * *